(12) United States Patent
Lin et al.

(10) Patent No.: US 12,069,811 B2
(45) Date of Patent: Aug. 20, 2024

(54) BONDING APPARATUS

(71) Applicant: AUO Corporation, Hsin-Chu (TW)

(72) Inventors: Yi-Hsin Lin, Hsin-Chu (TW);
Wen-Lung Chen, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 267 days.

(21) Appl. No.: 17/874,336

(22) Filed: Jul. 27, 2022

(65) Prior Publication Data
US 2023/0254981 A1 Aug. 10, 2023

(30) Foreign Application Priority Data
Feb. 10, 2022 (TW) .................................. 111104975

(51) Int. Cl.
| | |
|---|---|
| *H05K 3/32* | (2006.01) |
| *B23K 3/00* | (2006.01) |
| *B25B 11/00* | (2006.01) |
| *B29C 65/78* | (2006.01) |
| *B32B 38/18* | (2006.01) |
| *H01L 21/683* | (2006.01) |

(52) U.S. Cl.
CPC ................. *H05K 3/32* (2013.01); *B23K 3/00* (2013.01); *B25B 11/005* (2013.01); *B29C 65/7847* (2013.01); *B32B 38/1858* (2013.01); *H01L 21/6838* (2013.01)

(58) Field of Classification Search
CPC .. H05K 3/32; H05K 13/0408; H05K 13/0409; B23K 3/00; B25B 11/005; H01L 21/6838; B32B 38/1858; B29C 65/7847; B29C 65/02
USPC .......................................................... 29/743
See application file for complete search history.

(56) References Cited

U.S. PATENT DOCUMENTS

2006/0191631 A1 8/2006 Kojima et al.
2020/0388511 A1* 12/2020 Amano .................. B01D 47/00

FOREIGN PATENT DOCUMENTS

| TW | 200714158 A | 4/2007 |
|---|---|---|
| TW | I367699 B | 7/2012 |

\* cited by examiner

*Primary Examiner* — Carson Gross
(74) *Attorney, Agent, or Firm* — WPAT, P.C

(57) ABSTRACT

A bonding apparatus includes a vacuum holder and a thermal head. The vacuum holder is configured to attach a non-bonding area of a printed circuit board. A side of the vacuum holder has a first lower sidewall, a first upper sidewall, and a first connection surface adjoining the first lower sidewall and the first upper sidewall. The thermal head is adjacent to the vacuum holder and configured to hot press a bonding area of the printed circuit board. A side of the thermal head proximal to the vacuum holder has a second lower sidewall, a second upper sidewall, and a second connection surface adjoining the second lower sidewall and the second upper sidewall. The second connection surface overlaps at least a portion of the first connection surface, and a height of the second lower sidewall is greater than a height of the first lower sidewall.

15 Claims, 5 Drawing Sheets

BONDING APPARATUS

RELATED APPLICATIONS

This application claims priority to Taiwan Application Serial Number 111104975, filed Feb. 10, 2022, which is herein incorporated by reference.

BACKGROUND

Field of Invention

The present disclosure relates to a bonding apparatus.

Description of Related Art

Generally speaking, a chip on film (COF) can be bonded to a substrate by hot pressing, such that the pins of the substrate can be electrically connected to the bonding area of the chip on film.

A traditional bonding apparatus has a vacuum holder with a heating function. In use, the vacuum holder may attach the bonding area of the chip on film move the chip on film to a position above the substrate, and then the vacuum holder moves down to enable the chip on film to electrically connect to the pins of the substrate by hot pressing. However, the vacuum holder must be heated to have the hot pressing function, so it can only attach the bonding area of the chip on film. Furthermore, for a product with a small bonding area, requirements for the relative position and alignment accuracy between the vacuum holder and the product with the small bonding area are very high. In addition, since the chip on film is soft, the non-bonding area of the chip on film would warp due to material properties or gravity, and the non-bonding area of the chip on film would contact the substrate to cause interference when the vacuum holder approaches the substrate, which is not good for the stability of attaching and hot pressing.

SUMMARY

One aspect of the present disclosure provides a bonding apparatus for bonding or de-bonding a printed circuit board.

According to some embodiments of the present disclosure, a bonding apparatus includes a vacuum holder and a thermal head. The vacuum holder is configured to attach a non-bonding area of a printed circuit board. A side of the vacuum holder has a first lower sidewall, a first upper sidewall, and a first connection surface adjoining the first lower sidewall and the first upper sidewall. The thermal head is adjacent to the vacuum holder and is configured to hot press a bonding area of the printed circuit board. A side of the thermal head proximal to the vacuum holder has a second lower sidewall, a second upper sidewall, and a second connection surface adjoining the second lower sidewall and the second upper sidewall. The second connection surface overlaps at least a portion of the first connection surface, and a height of the second lower sidewall is greater than a height of the first lower sidewall.

In some embodiments, a distance between a bottom end of the first upper sidewall and a bottom surface of the vacuum holder is greater than or equal to a distance between a top end of the first lower sidewall and the bottom surface of the vacuum holder.

In some embodiments, a horizontal distance between the first upper sidewall and the first lower sidewall is greater than a horizontal distance between the second upper sidewall and the second lower sidewall.

In some embodiments, an angle between the first connection surface and a horizontal surface is smaller than or equal to an angle between the second connection surface and a horizontal surface.

In some embodiments, the thermal head has a hot pressing surface, and an edge of the hot pressing surface facing away from the vacuum holder is aligned with an edge of the printed circuit board.

In some embodiments, the thermal head has a third sidewall facing away from the second upper sidewall and the second lower sidewall, and a connection position between the hot pressing surface and each of the second lower sidewall and the third sidewall has a chamfer.

In some embodiments, the first connection surface of the vacuum holder is an inclined surface, and the first upper sidewall, the first connection surface, and the first lower sidewall define a wedge structure.

In some embodiments, the first connection surface of the vacuum holder is a horizontal surface, and the first upper sidewall, the first connection surface, and the first lower sidewall define a stepped structure.

In some embodiments, the second connection surface of the thermal head is an inclined surface, and the second upper sidewall, the second connection surface, and the second lower sidewall define a wedge structure.

In some embodiments, the second connection surface of the thermal head is a horizontal surface, and the second upper sidewall, the second connection surface, and the second lower sidewall define a stepped structure.

Another aspect of the present disclosure provides a bonding apparatus includes a vacuum holder and a thermal head.

According to some embodiments of the present disclosure, a bonding apparatus includes a vacuum holder and a thermal head. The vacuum holder is configured to attach a non-bonding area of a printed circuit board. A side of the vacuum holder has a first lower sidewall, a first upper sidewall, and a first connection surface adjoining the first lower sidewall and the first upper sidewall. The thermal head is adjacent to the vacuum holder and is configured to hot press a bonding area of the printed circuit board. A side of the thermal head proximal to the vacuum holder has a second lower sidewall, a second upper sidewall, and a second connection surface adjoining the second lower sidewall and the second upper sidewall. The second connection surface overlaps at least a portion of the first connection surface. A distance between a bottom end of the first upper sidewall and a bottom surface of the vacuum holder is greater than or equal to a distance between a top end of the first lower sidewall and the bottom surface of the vacuum holder.

In some embodiments, a horizontal distance between the first upper sidewall and the first lower sidewall is greater than a horizontal distance between the second upper sidewall and the second lower sidewall.

In some embodiments, an angle between the first connection surface and a horizontal surface is smaller than or equal to an angle between the second connection surface and a horizontal surface.

In some embodiments, the thermal head has a hot pressing surface, and an edge of the hot pressing surface facing away from the vacuum holder is aligned with an edge of the printed circuit board.

In some embodiments, the thermal head has a third sidewall facing away from the second upper sidewall and the second lower sidewall, and a connection position between the hot pressing surface and each of the second lower sidewall and the third sidewall has a chamfer.

In the aforementioned embodiments of the present disclosure, since the bonding apparatus includes the vacuum holder and the thermal head, the vacuum holder can be used to attach the non-bonding area of the printed circuit board, and the thermal head can be used to hot press the bonding area of the printed circuit board. The area of the non-bonding area is greater than the area of the bonding area, and thus the non-bonding area can be firmly attached by a larger vacuum holder. Moreover, an attaching position of the vacuum holder can be closer to the bonding area to decrease sagging of the bonding area due to weight, thereby preventing warpage caused by gravity and reducing misalignment of the vacuum holder. During the step of approaching a substrate with the vacuum holder, a contact between the printed circuit board and the substrate can be prevented so as not to cause interference, which facilitates the stability of attaching and hot pressing. In addition, since the volume of a portion of the thermal head facing away from the printed circuit board can be increased, the shrinking of the hot pressing end of the thermal head does not make the heated volume of the thermal head too small, which can prevent heat energy from dissipating too quickly and prevent a hot pressing temperature that cannot be maintained. During operation, the vacuum holder and the thermal head can move to the substrate together, which can prevent interference/collision between the vacuum holder and the thermal head due to tolerance and other factors. When the vacuum holder approaches the substrate to a predetermined position, the vacuum holder stops, and the thermal head can further moves down to hot press the bonding area of the printed circuit board such that the bonding area is electrically connected to the substrate. Since the height of the second lower sidewall of the thermal head is greater than the height of the first lower sidewall of the vacuum holder, it can be ensured that the overlapping parts of the thermal head and the vacuum holder do not contact with each other to avoid mechanism interference when the thermal head hot presses the bonding area of the printed circuit board.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
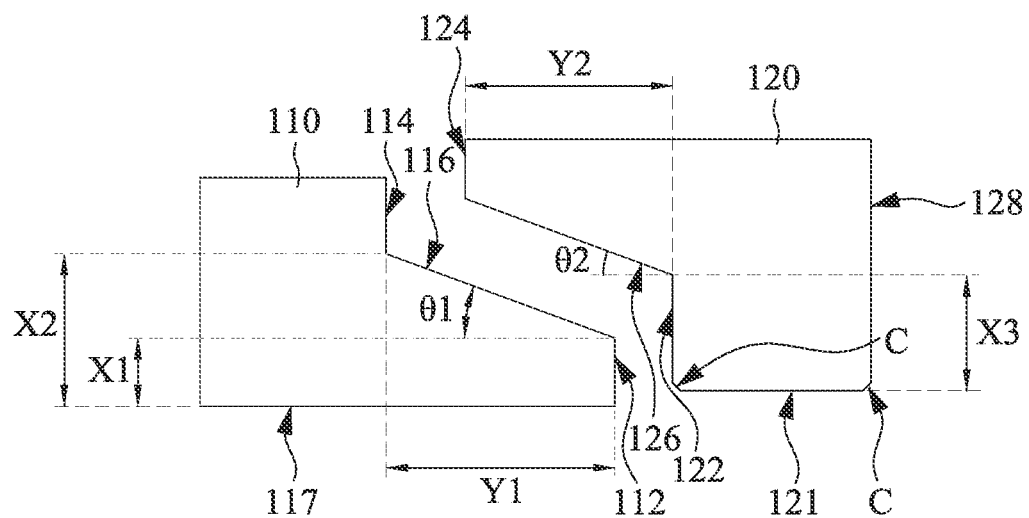
FIG. 1 is a side view of a bonding apparatus according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
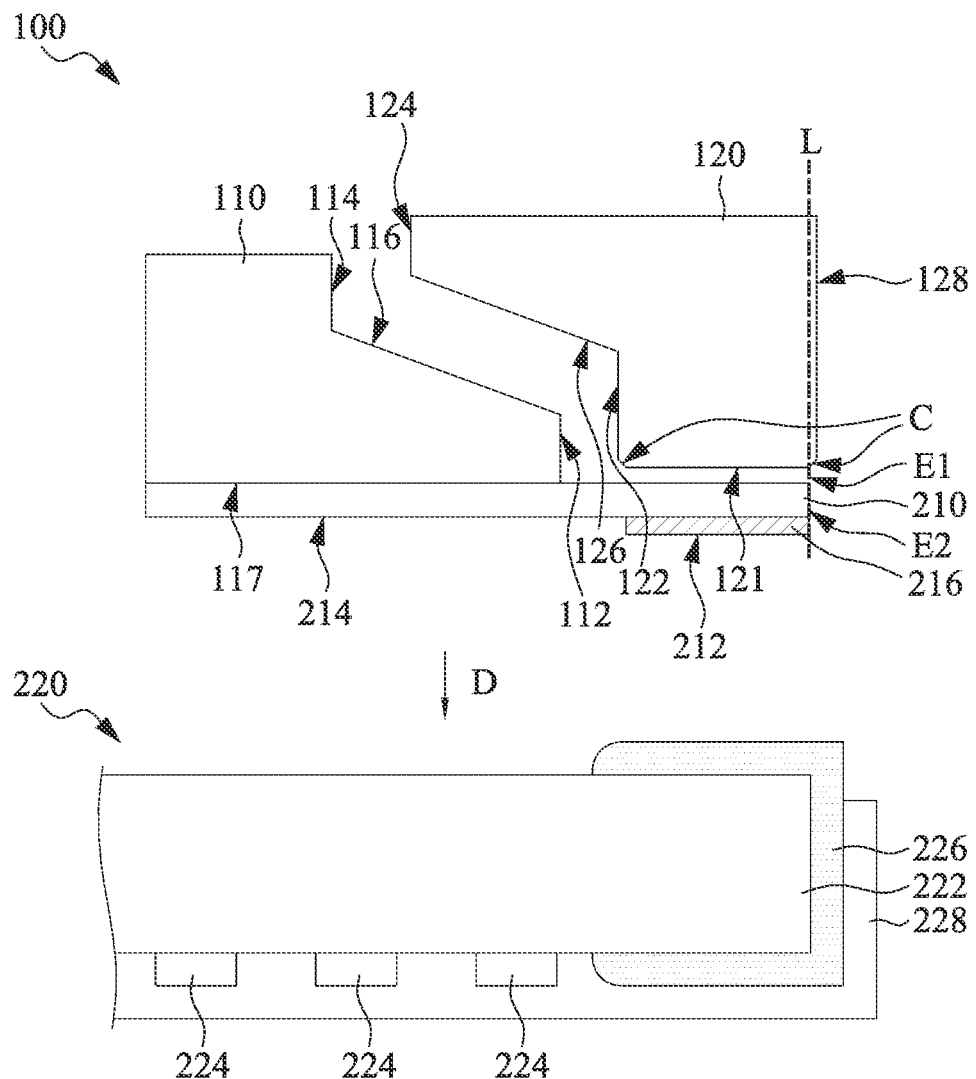
FIG. 2 is a schematic view of the bonding apparatus of FIG. 1 when attaching a printed circuit board but not hot pressing yet.

FIG. 1 is a side view of a bonding apparatus 100 according to one embodiment of the present disclosure. FIG. 2 is a schematic view of the bonding apparatus 100 of FIG. 1 when attaching a printed circuit board 210 but not hot pressing yet. As shown in FIG. 1 and FIG. 2, the bonding apparatus 100 includes a vacuum holder 110 and a thermal head 120, and is used to bond or de-bond the printed circuit board 210. The vacuum holder 110 is configured to attach a non-bonding area 214 of the printed circuit board 210. A side of the vacuum holder 110 has a first lower sidewall 112, a first upper sidewall 114, and a first connection surface 116 adjoining the first lower sidewall 112 and the first upper sidewall 114. The thermal head 120 is adjacent to the vacuum holder 110, and is configured to hot press a bonding area 212 of the printed circuit board 210. A side of the thermal head 120 proximal to the vacuum holder 110 has a second lower sidewall 122, a second upper sidewall 124, and a second connection surface 126 adjoining the second lower sidewall 122 and the second upper sidewall 124. The second connection surface 126 overlaps at least a portion of the first connection surface 116. In other words, the orthogonal projection of the second connection surface 126 on the printed circuit board 210 overlaps the orthogonal projection of the first connection surface 116 on the printed circuit board 210. Moreover, the second lower sidewall 112 of the vacuum holder 110 has a height X1, the second lower sidewall 122 of the thermal head 120 has a height X3, and the height X3 of the second lower sidewall 122 is greater than the height X1 of the first lower sidewall 122.

In some embodiments, the printed circuit board 210 may be, but not limited to a chip on film (COF). The printed circuit board 210 has the bonding area 212 and the non-bonding area 214, and the bonding area 212 has a conductive pin 216. The thermal head 120 can bond the conductive pin 216 of the printed circuit board 210 to a conductive pin 226 of a lighting module 220, such that the printed circuit board 210 is electrically connected to plural light sources 224, such as light emitting diodes, but the present disclosure is not limited in this regard. In addition, the lighting module 220 further has a molding layer 228 covering the light sources 224 to provide protection.

In the following description, operation steps of the bonding apparatus 100 will be explained.

As shown in FIG. 2, since the bonding apparatus 100 includes the vacuum holder 110 and the thermal head 120, the vacuum holder 110 can attach the non-bonding area 214 of the printed circuit board 210 before hot pressing. At this moment, a hot pressing surface 121 of the thermal head 120 is located above the bonding area 212 of the printed circuit board 210 and is separated from the bonding area 212 by a gap. Thereafter, the vacuum holder 110 and the thermal head 120 may move in a direction D together, such that the printed circuit board 210 moves along with the vacuum holder 110 to approach the lighting module 220.

Since the area of the non-bonding area 214 of the printed circuit board 210 is greater than the area of the bonding area 212, and thus the non-bonding area 214 can be firmly attached by a larger vacuum holder 110. Therefore, warpage caused by gravity can be prevented, thereby reducing the alignment deviation of the vacuum holder 110. Moreover, during the step of approaching the substrate 222 of the lighting module 220 with the vacuum holder 110, a contact between the printed circuit board 210 and the substrate 222 can be prevented so as not to cause interference, which facilitates the stability of attaching and hot pressing.

In this embodiment, an edge E1 of the hot pressing surface 121 of the thermal head 120 facing away from the vacuum holder 110 is aligned with an edge E2 of the printed circuit board 210, as shown at a dotted line L of FIG. 2. Such a configuration may prevent an adhesive (not shown, such as an anisotropic conductive film) below the conductive pin 216 from adhering to the thermal head 120. Furthermore, the thermal head 120 has a third sidewall 128 facing away from the second upper sidewall 124 and the second lower sidewall 122, and a connection position between the hot pressing surface 121 each of the second lower sidewall 122 and the third sidewall 128 has a chamfer C.

Figure 3:
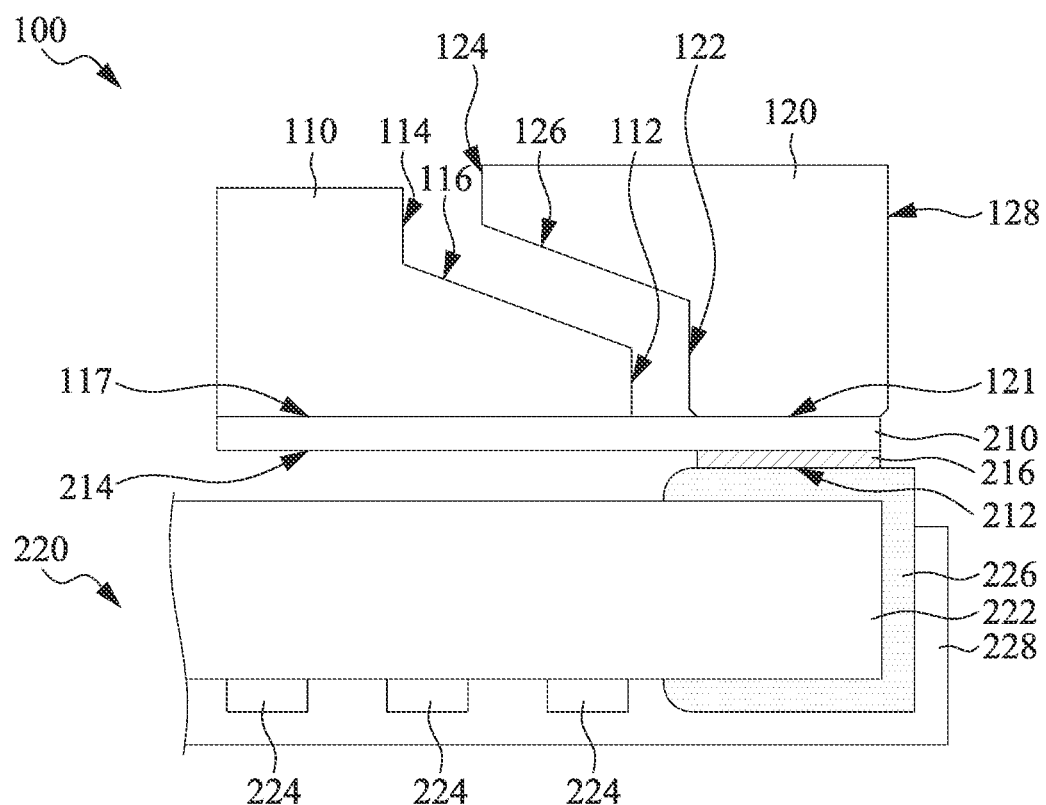
FIG. 3 is a schematic view of the bonding apparatus of FIG. 2 when pressing the printed circuit board.

FIG. 3 is a schematic view of the bonding apparatus 100 of FIG. 2 when pressing the printed circuit board 210. As shown in FIG. 2 and FIG. 3, the vacuum holder 110 and the thermal head 120 may move in the direction D together to a predetermined position above the substrate 222, which can prevent interference/collision between the vacuum holder 110 and the thermal head 120 due to tolerance and other factors. The aforementioned advantage of preventing the interference between the vacuum holder 110 and the thermal head 120 exists regardless of whether a flexible printed circuit board 210 or a rigid printed circuit board 210 is used. Thereafter, when the vacuum holder 110 approaches the substrate 222 to the aforesaid predetermined position, the vacuum holder 110 stops, and the thermal head 120 may further move the bonding area 212 of the printed circuit board 210 downwardly, such that the conductive pin 216 of the bonding area 212 is electrically connected to the conductive pin 226 of the substrate 222. In some embodiments, the conductive pin 216 of the printed circuit board 210 may be covered by an anisotropic conductive film (ACF), and the ACF and the conductive pin 216 are hot pressed on the conductive pin 226 on the substrate 222 together by the thermal head 120, but the present disclosure is not limited in this regard. In some embodiments, the thermal head 120 may cooperate with a buffer material (not shown). For a bonding area after a printed circuit board is bonded to a substrate by hot pressing, another hot pressing may be performed again to ensure an electrical connection.

The vacuum holder 110 not only attach the larger non-bonding area 214 of the printed circuit board 210 to prevent warpage, but also its attaching position is further close to the bonding area 212 of the printed circuit board 210, thereby decreasing the sagging of the bonding area 212 due to weight. Moreover, because the vacuum holder 110 is separated from the thermal head 120, the vacuum holder 110 can be closer to the bonding area 212, and the volume of the portion of the thermal head 120 facing away from the printed circuit board 210 (e.g., the upper portion of the thermal head 120) can be increased. As a result, even if the shrinking of the hot pressing end of the thermal head 120 (e.g., the portion proximal to the hot pressing surface 121) does not make the heated volume of the thermal head 120 too small, which can prevent heat energy from dissipating too quickly and prevent a hot pressing temperature that cannot be maintained. Due to the shrinking of the hot pressing end of the thermal head 120, the vacuum holder 110 can further close to the bonding area 212. In addition, the vacuum holder 110 and the thermal head 120 may not only be used to the COF printed circuit board 210, but also be used to a rigid printed circuit board which is thinned, thereby solving the warpage problem.

Referring back to FIG. 1, since the height X3 of the second lower sidewall 122 of the thermal head 120 is greater than the height X1 of the first lower sidewall 112 of the vacuum holder 110, it can be ensured that the overlapping parts of the thermal head 120 and the vacuum holder 110 do not contact with each other to avoid mechanism interference when the thermal head 120 hot presses the bonding area 212 of the printed circuit board 210. In this embodiment, a distance X2 between the bottom end of the first upper sidewall 114 and a bottom surface 117 of the vacuum holder 110 is greater than a distance X1 between the top end of the first lower sidewall 112 of the vacuum holder 110 and the bottom surface 117 of the vacuum holder 110, an angle θ1 between the first connection surface 116 and a horizontal surface is smaller than or equal to an angle θ2 between the second connection surface 126 and a horizontal surface, and a horizontal distance Y1 between the first upper sidewall 114 and the first lower sidewall 112 is greater than a horizontal distance Y2 between the second upper sidewall 124 and the second lower sidewall 122. The aforementioned configuration may further prevent the thermal head 120 from being in contact with the vacuum holder 110 when the thermal head 120 moves down to perform hot pressing. In the embodiment of FIG. 1, the angle θ1 and the angle θ2 may be acute angles. In other embodiments, the angle θ1 and the angle θ2 may be zero, such as the structure shown in FIG. 5.

In this embodiment, the first connection surface 116 of the vacuum holder 110 is an inclined surface, and the first upper sidewall 114, the first connection surface 116, and the first lower sidewall define 112 a wedge structure. The second connection surface 126 of the thermal head 120 is an inclined surface, and the second upper sidewall 124, the second connection surface 126, and the second lower sidewall 122 define a wedge structure. As a result, the vacuum holder 110 has a structure having a narrow top portion and a wide bottom portion, which facilitates to attach the non-bonding area 214 (see FIG. 3) of the printed circuit board 210. Furthermore, the thermal head 120 has a structure having a wide top portion and a narrow bottom portion, which facilitates to provide a sufficiently high and uniform temperature to the hot pressing surface 121 for hot pressing the bonding area 212 (see FIG. 3) of the printed circuit board 210.

It is to be noted that the connection relationships, the materials, and the advantages of the elements described above will not be repeated in the following description. In the following description, other types of bonding apparatuses will be described.

Figure 4:
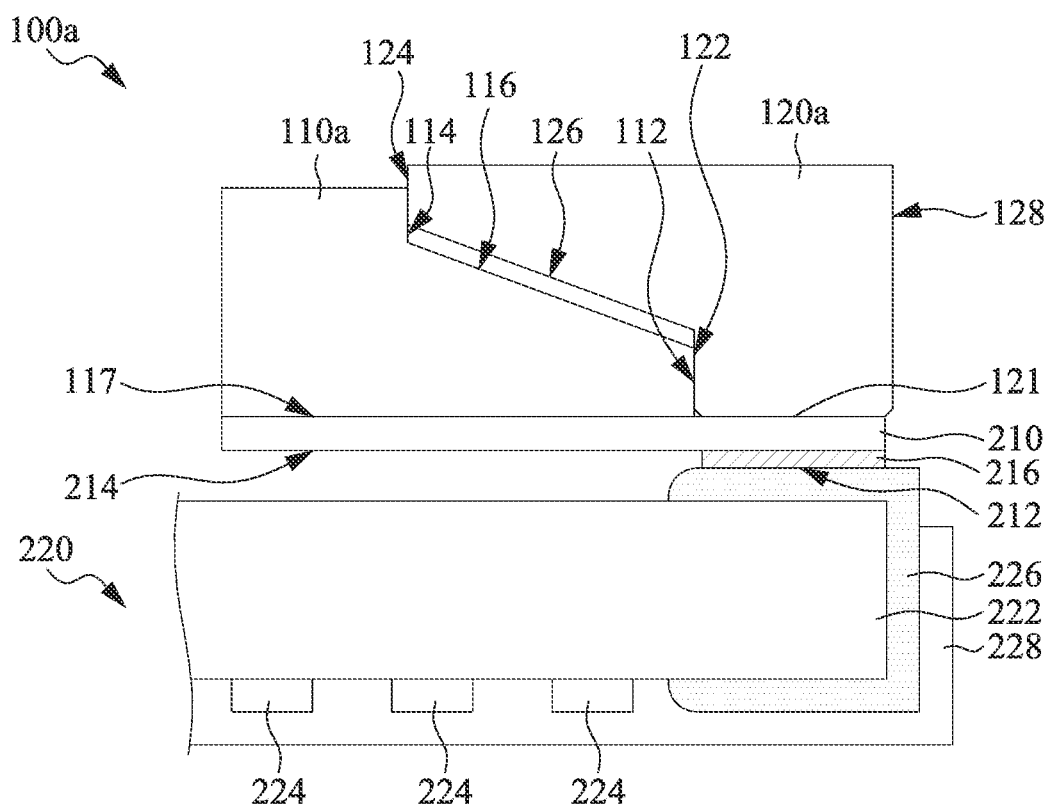
FIG. 4 is a schematic view of a bonding apparatus when pressing a printed circuit board according to one embodiment of the present disclosure.

FIG. 4 is a schematic view of a bonding apparatus 100a when pressing the printed circuit board 210 according to one embodiment of the present disclosure. The bonding apparatus 100a includes a vacuum holder 110a and a thermal head 120a. The difference between this embodiment and the embodiment of FIG. 3 is that the vacuum holder 110a and the thermal head 120a are detachably abutted against with each other. For example, the first lower sidewall 112 and the first upper sidewall 114 of the vacuum holder 110a are respectively in contact with the second lower sidewall 122 and the second upper sidewall 124 of the thermal head 120a, such that the vacuum holder 110a and the thermal head 120a may close together.

As a result of such a configuration, the vacuum holder 110a may be used to attach the non-bonding area 214 of the printed circuit board 210, while the thermal head 120a may be used to hot press the bonding area 212 of the printed circuit board 210. During the movement of the vacuum holder 110a and the thermal head 120a or when the thermal head 120a performs hot pressing, the vacuum holder 110a can firmly attach the printed circuit board 210 to prevent the warpage of the printed circuit board 210 caused by gravity, thereby preventing the printed circuit board 210 from being in contact with the substrate 222 of the lighting module 220.

Figure 5:
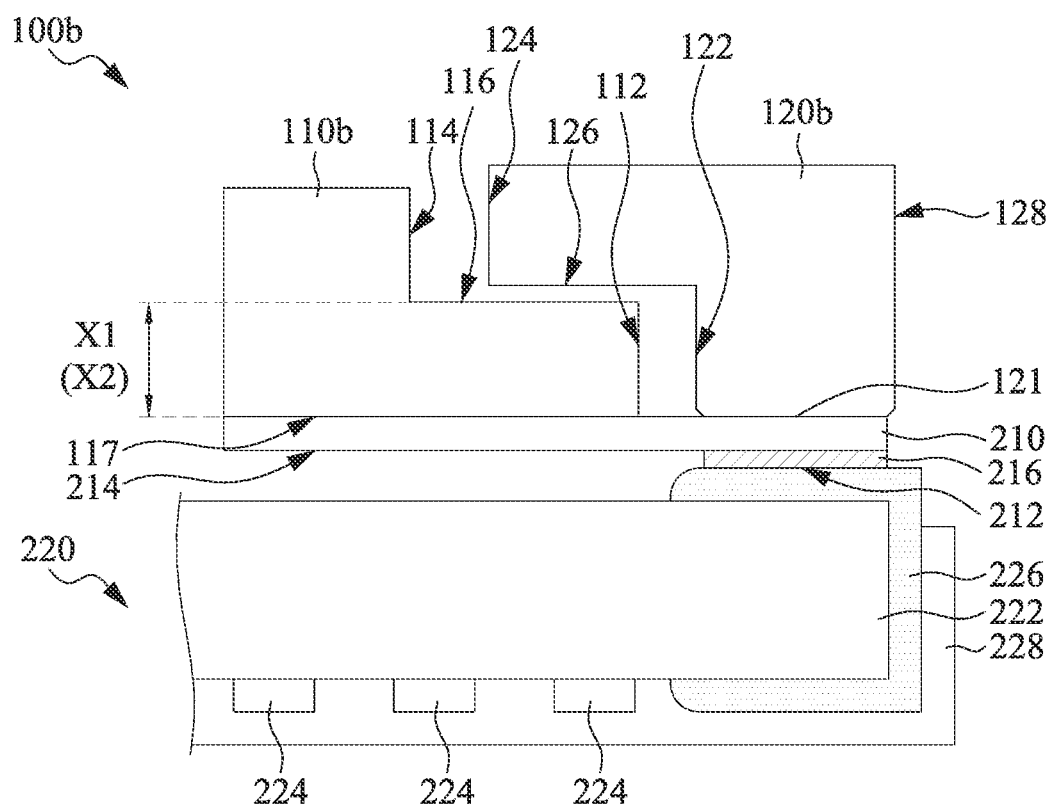
FIG. 5 is a schematic view of a bonding apparatus when pressing a printed circuit board according to one embodiment of the present disclosure.

FIG. 5 is a schematic view of a bonding apparatus 100b when pressing the printed circuit board 210 according to one embodiment of the present disclosure. The bonding apparatus 100b includes a vacuum holder 110b and a thermal head 120b. The difference between this embodiment and the embodiment of FIG. 3 is that the distance X2 between the bottom end of the first upper sidewall 114 of the vacuum holder 110b and the bottom surface 117 of the vacuum holder 110b is equal to the distance X1 between the top end of the first lower sidewall 112 of the vacuum holder 110b and the bottom surface 117 of the vacuum holder 110b. Moreover, the first connection surface 116 of the vacuum holder 110b is a horizontal surface, and the first upper sidewall 114, the first connection surface 116, and the first lower sidewall 112 define a stepped structure. The second connection surface 126 of the thermal head 120b is a horizontal surface, and the second upper sidewall 124, the second connection surface 126, and the second lower sidewall 122 define a stepped structure.

As a result of such a configuration, the vacuum holder 110b may be used to attach the non-bonding area 214 of the printed circuit board 210, while the thermal head 120b may be used to hot press the bonding area 212 of the printed circuit board 210. During the movement of the vacuum holder 110b and the thermal head 120b or when the thermal head 120b performs hot pressing, the vacuum holder 110b can firmly attach the printed circuit board 210 to prevent the warpage of the printed circuit board 210 caused by gravity, thereby preventing the printed circuit board 210 from being in contact with the substrate 222 of the lighting module 220.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bonding apparatus for bonding or de-bonding a printed circuit board, comprising:
   a vacuum holder configured to attach a non-bonding area of the printed circuit board, wherein a side of the vacuum holder has a first lower sidewall, a first upper sidewall, and a first connection surface adjoining the first lower sidewall and the first upper sidewall; and
   a thermal head adjacent to the vacuum holder and configured to hot press a bonding area of the printed circuit board, wherein a side of the thermal head proximal to the vacuum holder has a second lower sidewall, a second upper sidewall, and a second connection surface adjoining the second lower sidewall and the second upper sidewall, the second connection surface overlaps at least a portion of the first connection surface, and a height of the second lower sidewall is greater than a height of the first lower sidewall.

2. The bonding apparatus of claim 1, wherein a distance between a bottom end of the first upper sidewall and a bottom surface of the vacuum holder is greater than or equal to a distance between a top end of the first lower sidewall and the bottom surface of the vacuum holder.

3. The bonding apparatus of claim 1, wherein a horizontal distance between the first upper sidewall and the first lower sidewall is greater than a horizontal distance between the second upper sidewall and the second lower sidewall.

4. The bonding apparatus of claim 1, wherein an angle between the first connection surface and a horizontal surface is smaller than or equal to an angle between the second connection surface and a horizontal surface.

5. The bonding apparatus of claim 1, wherein the thermal head has a hot pressing surface, and an edge of the hot pressing surface facing away from the vacuum holder is aligned with an edge of the printed circuit board.

6. The bonding apparatus of claim 5, wherein the thermal head has a third sidewall facing away from the second upper sidewall and the second lower sidewall, and a connection position between the hot pressing surface and each of the second lower sidewall and the third sidewall has a chamfer.

7. The bonding apparatus of claim 1, wherein the first connection surface of the vacuum holder is an inclined surface, and the first upper sidewall, the first connection surface, and the first lower sidewall define a wedge structure.

8. The bonding apparatus of claim 1, wherein the first connection surface of the vacuum holder is a horizontal surface, and the first upper sidewall, the first connection surface, and the first lower sidewall define a stepped structure.

9. The bonding apparatus of claim 1, wherein the second connection surface of the thermal head is an inclined surface, and the second upper sidewall, the second connection surface, and the second lower sidewall define a wedge structure.

10. The bonding apparatus of claim 1, wherein the second connection surface of the thermal head is a horizontal surface, and the second upper sidewall, the second connection surface, and the second lower sidewall define a stepped structure.

11. A bonding apparatus for bonding or de-bonding a printed circuit board, comprising:
    a vacuum holder configured to attach a non-bonding area of the printed circuit board, wherein a side of the vacuum holder has a first lower sidewall, a first upper sidewall, and a first connection surface adjoining the first lower sidewall and the first upper sidewall; and
    a thermal head adjacent to the vacuum holder and configured to hot press a bonding area of the printed circuit board, wherein a side of the thermal head proximal to the vacuum holder has a second lower sidewall, a second upper sidewall, and a second connection surface adjoining the second lower sidewall and the second upper sidewall, the second connection surface overlaps at least a portion of the first connection surface, and a distance between a bottom end of the first upper sidewall and a bottom surface of the vacuum holder is greater than or equal to a distance between a top end of the first lower sidewall and the bottom surface of the vacuum holder.

12. The bonding apparatus of claim 11, wherein a horizontal distance between the first upper sidewall and the first lower sidewall is greater than a horizontal distance between the second upper sidewall and the second lower sidewall.

13. The bonding apparatus of claim 11, wherein an angle between the first connection surface and a horizontal surface is smaller than or equal to an angle between the second connection surface and a horizontal surface.

14. The bonding apparatus of claim 11, wherein the thermal head has a hot pressing surface, and an edge of the hot pressing surface facing away from the vacuum holder is aligned with an edge of the printed circuit board.

15. The bonding apparatus of claim 14, wherein the thermal head has a third sidewall facing away from the second upper sidewall and the second lower sidewall, and a connection position between the hot pressing surface and each of the second lower sidewall and the third sidewall has a chamfer.

* * * * *